(12) United States Patent
Vasan et al.

(10) Patent No.: US 10,511,269 B2
(45) Date of Patent: Dec. 17, 2019

(54) VOLTAGE-TO-CURRENT CONVERTERS

(71) Applicant: TEXAS INSTRUMENTS INCORPORATED, Dallas, TX (US)

(72) Inventors: Bharath Karthik Vasan, Tucson, AZ (US); Srinivas K. Pulijala, Tucson, AZ (US); Steven G. Brantley, Satellite Beach, FL (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/995,355

(22) Filed: Jun. 1, 2018

(65) Prior Publication Data

US 2019/0097587 A1 Mar. 28, 2019

Related U.S. Application Data

(60) Provisional application No. 62/562,590, filed on Sep. 25, 2017.

(51) Int. Cl.
*H03F 1/32* (2006.01)
*H03F 3/45* (2006.01)
*H03F 3/21* (2006.01)

(52) U.S. Cl.
CPC ......... *H03F 1/3205* (2013.01); *H03F 1/3211* (2013.01); *H03F 3/211* (2013.01); *H03F 3/45076* (2013.01); *H03F 3/45085* (2013.01); *H03F 3/45094* (2013.01); *H03F 2203/45392* (2013.01); *H03F 2203/45562* (2013.01); *H03F 2203/45644* (2013.01)

(58) Field of Classification Search
CPC ..................................................... H03F 1/3205
See application file for complete search history.

(56) References Cited

U.S. PATENT DOCUMENTS

| | | | |
|---|---|---|---|
| 6,704,560 B1 * | 3/2004 | Balteanu | H03F 1/3211 330/257 |
| 7,532,069 B2 * | 5/2009 | Ito | H03F 3/45179 330/253 |
| 2005/0090209 A1 * | 4/2005 | Behzad | H03F 1/0261 455/115.1 |
| 2015/0155843 A1 * | 6/2015 | Scott | H03F 1/0272 330/285 |
| 2018/0316323 A1 * | 11/2018 | Sugimoto | H03F 3/45094 |

* cited by examiner

*Primary Examiner* — Patricia T Nguyen
(74) *Attorney, Agent, or Firm* — John R. Pessetto; Charles A. Brill; Frank D. Cimino

(57) ABSTRACT

A voltage-to-current converter that reduces third harmonic distortion. An amplifier includes an input stage. The input stage includes a first voltage-to-current conversion stage and a second voltage-to-current conversion stage. The first voltage-to-current conversion stage is configured to provide an input to output gain with compressive nonlinearity. The second voltage-to-current stage is cascaded with the first voltage-to-current conversion stage. An input of the second voltage-to-current stage is connected to an output of the first voltage-to-current conversion stage. The second voltage-to-current conversion stage is configured to provide an input to output gain with expansive nonlinearity.

17 Claims, 7 Drawing Sheets

VOLTAGE-TO-CURRENT CONVERTERS

RELATED APPLICATIONS

This application claims priority to U.S. Provisional Application No. 62/562,590, filed Sep. 25, 2017, entitled "V-to-I Converters with HD3 Cancellations," which is hereby incorporated by reference.

BACKGROUND

A voltage-to-current converter produces an output current that is proportional to an input voltage. Voltage-to-current converters are used in a variety of applications. For example, the input stage of an amplifier may include a voltage-to-current converter to convert an input voltage signal into a current signal for amplification by an output stage. Nonlinearity in the transfer function of the voltage-to-current converter causes distortion in the output signal of the voltage-to-current converter, which degrades amplifier harmonic distortion.

SUMMARY

A voltage-to-current converter that reduces third harmonic distortion is disclosed herein. In some examples, an implementation of the voltage-to-current converter is used in the input stage of an amplifier. In one example, an amplifier includes an input stage. The input stage includes a first voltage-to-current conversion stage and a second voltage-to-current conversion stage. The first voltage-to-current conversion stage is configured to provide an input-to-output gain with compressive nonlinearity. The second voltage-to-current stage is cascaded with the first voltage-to-current conversion stage. An input of the second voltage-to-current stage is connected to an output of the first voltage-to-current conversion stage. The second voltage-to-current conversion stage is configured to provide an input to output gain with expansive nonlinearity.

In another example, a voltage-to-current converter includes a first stage and a second stage. The first stage includes a first transistor and a second transistor connected as a differential pair. The second stage is cascaded with the first stage. The second stage includes a third transistor and a fourth transistor. The third transistor is coupled to the first transistor. The third transistor is connected to an output terminal of the first transistor and is connected to generate a first current output of the second stage at an output terminal of the third transistor. The fourth transistor is coupled to the second transistor. The fourth transistor is connected to an output terminal of the second transistor and is connected to generate a second current output of the second stage at an output terminal of the fourth transistor.

In a further example, a voltage-to-current converter includes a first stage and a second stage. The first stage includes a first transistor and a second transistor connected as a differential pair. The second stage is cascaded with the first stage. The second stage includes a third transistor, a fourth transistor, a fifth transistor, and a sixth transistor. The third transistor is coupled to the first transistor. The third transistor includes an emitter terminal that is connected to a collector terminal of the first transistor, and includes a collector terminal to provide a first current output of the second stage. The fourth transistor is coupled to the second transistor. The fourth transistor includes an emitter terminal connected to a collector terminal of the second transistor, and includes a collector terminal to provide a second current output of the second stage. The fifth transistor is connected as a diode. The fifth transistor includes an emitter terminal that is connected to the collector terminal of the second transistor, and is connected to the emitter terminal of the fourth transistor. The sixth transistor is connected as a diode. The sixth transistor includes an emitter terminal that is connected to the collector terminal of the first transistor, and is connected to the emitter terminal of the third transistor.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

A variety of techniques have been applied in an attempt to linearize voltage-to-current converters, and reduce third harmonic distortion, by improving the linearity of an input differential pair. Side effects of such techniques include increased noise, increased offset voltage, increased power consumption, and/or increased higher order nonlinearity. The voltage-to-current converters disclosed herein cascade two voltage-to-current stages to provide a reduction in third harmonic distortion. The first stage is a differential pair that has a compressive nonlinearity. The second stage has an expanding nonlinearity and generates a third harmonic distortion that cancels the third harmonic distortion produced by the first stage. The voltage-to-current converters of the present disclosure provide cancellation of third harmonic distortion with negligible increases in noise and/or power consumption, and can be used in conjunction with other linearization techniques.

Figure 1:
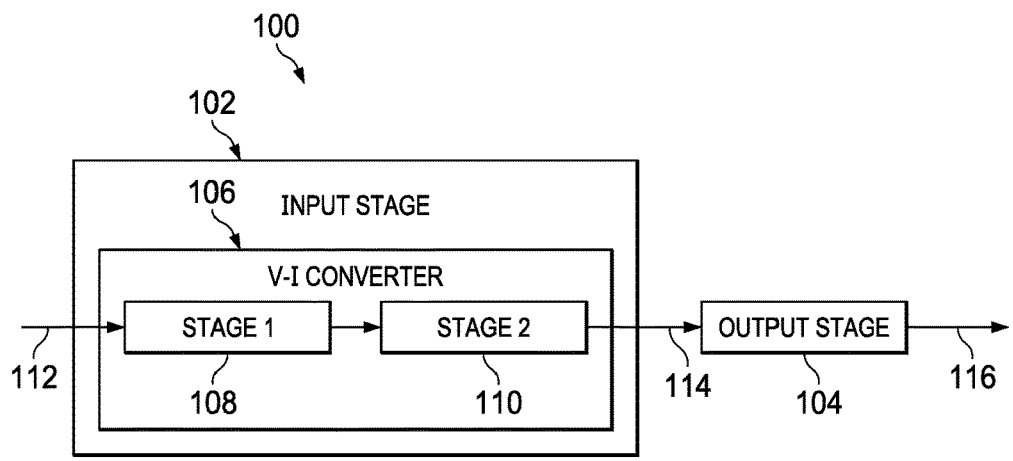
FIG. 1 shows a block diagram for an example of an amplifier that includes a two-stage voltage-to-current converter in accordance with the present disclosure.

FIG. 1 shows a block diagram for an example of an amplifier 100 that includes a two-stage voltage-to-current converter in accordance with the present disclosure. The amplifier 100 includes an input stage 102 and an output stage 104. The input stage 102 receives a signal 112 to be amplified, applies gain to the received signal 112, and provides an output signal 114 to the output stage 104. The output stage 104 applies additional gain to the signal 114 received from the input stage 102 to produce an output signal 116 of the amplifier 100.

The input stage 102 includes a voltage-to-current converter 106. The voltage-to-current converter 106 converts voltage of the signal 112 to a current that is suitable for amplification in the amplifier 100. The voltage-to-current converter 106 includes a first voltage-to-current conversion stage 108 and a second voltage-to-current conversion stage 110. The voltage-to-current conversion stage 110 is cascaded with the voltage-to-current conversion stage 108. The voltage-to-current conversion stage 108 receives the signal 112, converts the voltage of the signal 112 to a current, and converts the current to an output voltage. The voltage-to-current conversion stage 110 receives voltage output of the voltage-to-current conversion stage 108 and converts the voltage output of the voltage-to-current conversion stage 108 to a current.

Figure 2:
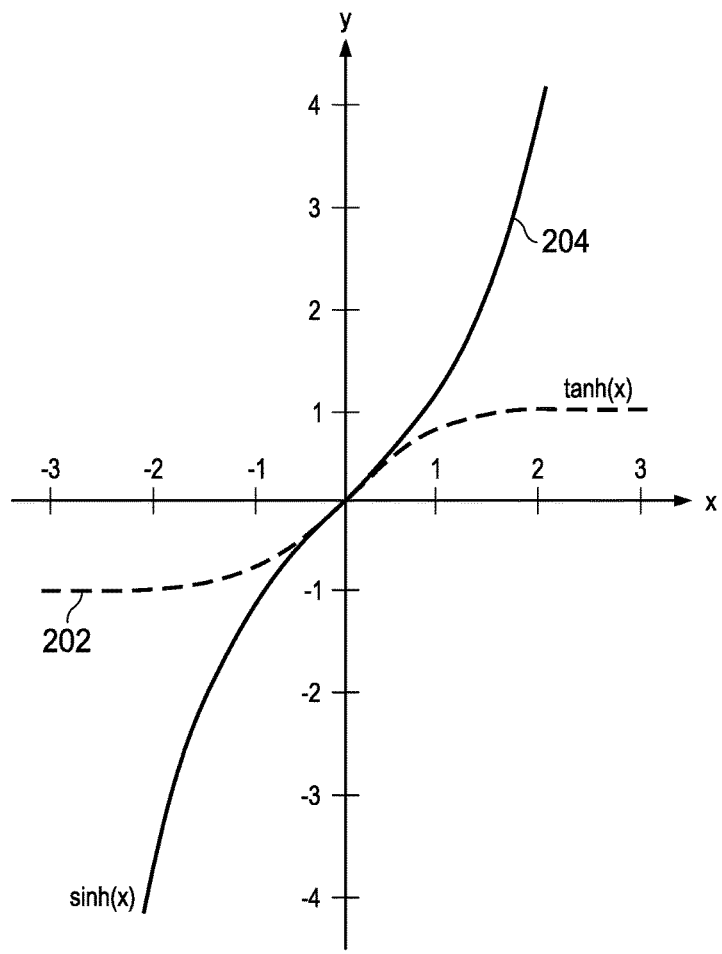
FIG. 2 illustrates hyperbolic tangent and hyperbolic sine gain functions respectively provided by the first and second stages of a voltage-to-current converter in accordance with the present disclosure.

The voltage-to-current conversion stage 110 provides a gain function that linearizes the output of the voltage-to-current conversion stage 108. The voltage-to-current conversion stage 108 provides a gain function that is described as compressive nonlinearity. For example, the compressive nonlinearity provided by the voltage-to-current conversion stage 108 is represented by a hyperbolic tangent function. FIG. 2 shows a graph of a hyperbolic tangent function 202. Compressive nonlinearity as illustrated by the hyperbolic tangent function 202 provides a relatively linear gain with respect to a range of input signal amplitudes, but the gain curve flattens with increasing input signal amplitude to compress the output signal dynamic range. To compensate for the compressive nonlinearity of the voltage-to-current conversion stage 108, the voltage-to-current conversion stage 110 provides a gain function that is described as expansive nonlinearity. For example, the expansive nonlinearity provided by the voltage-to-current conversion stage 110 is represented by a hyperbolic sine function. FIG. 2 shows a graph of a hyperbolic sine function 204. Expansive nonlinearity as illustrated by the hyperbolic sine function 204 provides a relatively linear gain with respect to a range of input signal amplitudes, but the gain increases exponentially with increasing input signal amplitude. The expansive nonlinearity of the voltage-to-current conversion stage 110 compensates for the compressive nonlinearity of the voltage-to-current conversion stage 108. That is, the voltage-to-current conversion stage 110 generates a third harmonic distortion component that cancels the third harmonic distortion component produced by the voltage-to-current conversion stage 108.

Figure 3:
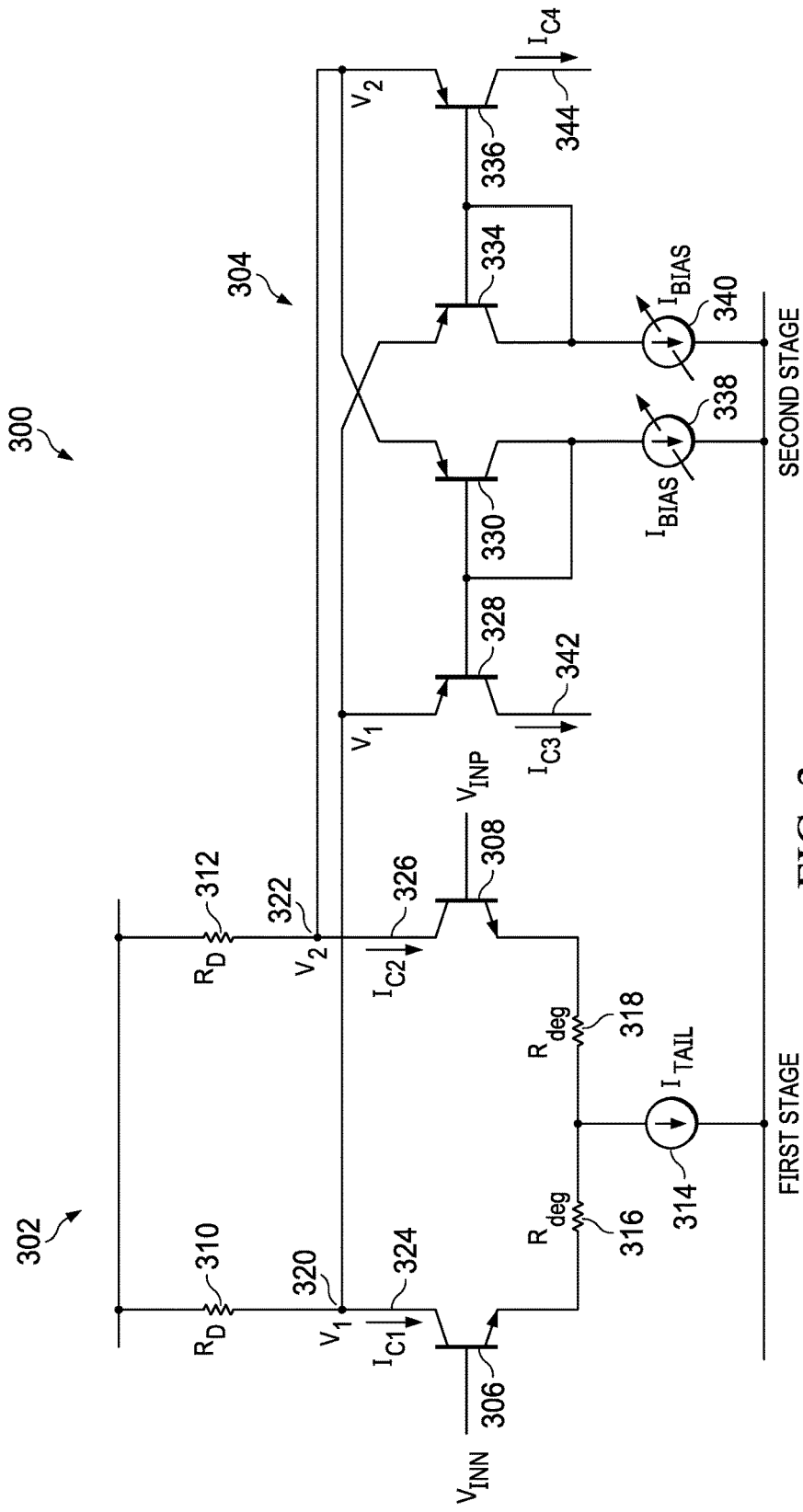
FIG. 3 shows a schematic diagram for a first example of a two-stage voltage-to-current converter in accordance with the present disclosure.

FIG. 3 shows a schematic diagram for an example of a two-stage voltage-to-current converter 300 in accordance with the present disclosure. The two-stage voltage-to-current converter 300 is an implementation of the voltage-to-current converter 106. The two-stage voltage-to-current converter 300 includes a first voltage-to-current conversion stage 302 and a second voltage-to-current conversion stage voltage-to-current conversion stage 304. The voltage-to-current conversion stage 304 is cascaded with the voltage-to-current-to-voltage conversion stage 302. The voltage-to-current conversion stage 302 and the voltage-to-current conversion stage 304 are implementations of the voltage-to-current conversion stage 108 and the voltage-to-current conversion stage 110 respectively.

The voltage-to-current conversion stage 302 includes transistor 306 and transistor 308 connected as a differential pair. The transistor 306 and the transistor 308 are n-type, p-type, n-type (NPN) bipolar transistors in some implementations. The transistor 306 receives a negative side ($V_{INN}$) of the input signal and the transistor 308 receives a positive side ($V_{INP}$) of the input signal. The transistor 306 and transistor 308 are coupled to a power source by the resistor 310 and the resistor 312, and coupled to a voltage reference by the current source 314. Some implementations of the voltage-to-current conversion stage 302 include the degradation resistors 316 and 318 to improve the linearity of the voltage-to-current conversion stage 302. Some implementations of the voltage-to-current conversion stage 302 lack the degradation resistors 316 and 318.

The differential pair formed by the transistor 306 and the transistor 308 provides a hyperbolic tangent relationship between collector currents $I_{C1}$ and $I_{C2}$ and input differential voltage, $V_D=V_{INN}-V_{INP}$. As explained above, the hyperbolic tangent is a compressive nonlinearity.

The voltage-to-current conversion stage 304 includes transistor 328, transistor 330, transistor 334, transistor 336, current source 338, and current source 340. The transistor 328, the transistor 330, the transistor 334, and the transistor 336 are p-type, n-type, p-type (PNP) bipolar transistors in some implementations. The transistor 328 (i.e., an input (emitter) terminal of the transistor 328) and the transistor 334 (i.e., an input (emitter) terminal of the transistor 334) are connected to output 320 of the voltage-to-current conversion stage 302. The transistor 330 (i.e., an input (emitter) terminal of the transistor 330) and the transistor 336 (i.e., an input (emitter) terminal of the transistor 336) are connected to output 322 of the voltage-to-current conversion stage 302. The output 320 is connected to a collector terminal 324 of the transistor 306, and the output 322 is connected to a collector terminal 326 of the transistor 308. The transistor 330 and the transistor 334 are connected as diodes. A control terminal (i.e., a base terminal) of the transistor 330 is connected to a control terminal (i.e., a base terminal) of the transistor 328, and a control terminal (i.e., a base terminal) of the transistor 334 is connected to a control terminal (i.e., a base terminal) of the transistor 336.

The transistor 328 (i.e., an output (collector) terminal 342 of the transistor 328) outputs the current $I_{C3}$ and the transistor 336 (i.e., an output (collector) terminal 344 of the transistor 336) outputs the current $I_{C4}$. The relationship between the output currents $I_{C3}$ and $I_{C4}$ and the input voltage received from the voltage-to-current conversion stage 302 (i.e., base-emitter voltage of the transistor 328) is exponential (hyperbolic sine), which, as explained above, is an expansive nonlinearity. For the two-stage voltage-to-current converter 300, the relationship of output differential current to input differential voltage is expressed as:

$$V_D = V_{INN} - V_{INP}$$

$$I_{OUT} = I_{C3} - I_{C4}$$

$$I_{OUT} = -2I_{BIAS}\sinh\left\{\frac{\alpha_F I_{TAIL}\tanh\left(\frac{V_D}{2V_{TH}}\right)R_D}{V_{TH}} + \frac{I_{OUT}\alpha_F R_D}{V_{TH}}\right\}$$

where:

$V_{TH}$ is thermal voltage of the PN junction; and $\alpha_F$ is common-base current gain.

Figure 4:
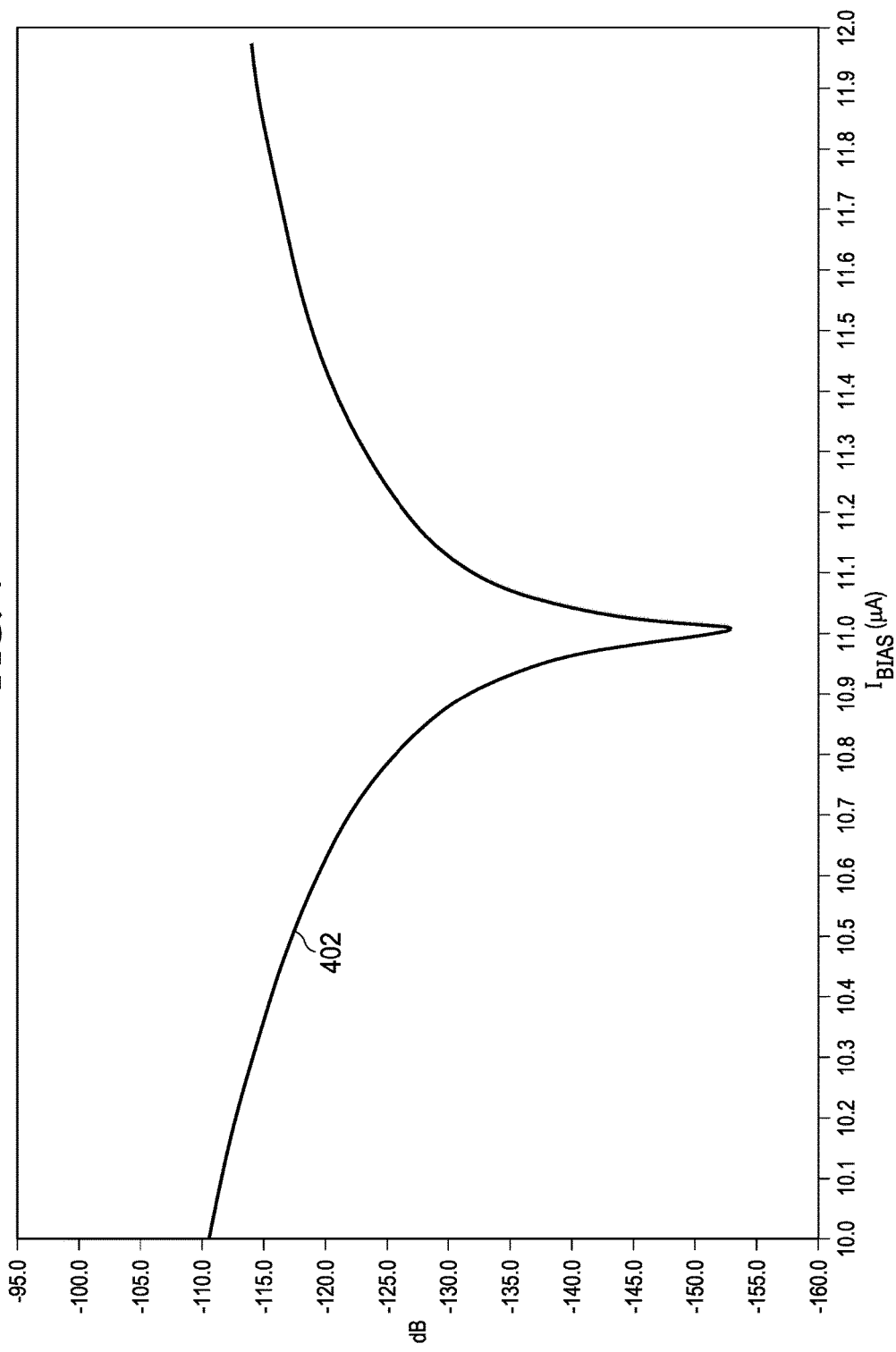
FIG. 4 shows a graph of third harmonic distortion versus bias current in a two-stage voltage-to-current converter in accordance with the present disclosure.

The current source 338 is coupled to an output terminal (i.e., a collector terminal) of the transistor 330 and to a control terminal of the transistor 328. The current source 340 is coupled to an output terminal (i.e., a collector terminal) of the transistor 334 and to a control terminal of the transistor 336. For a given differential input voltage, $V_D$, there is a current $I_{BIAS}$ generated by the current source 338 and the current source 340 for which the third order nonlinearity on the transfer function approaches zero. In other words, the quiescent current density of transistors in the voltage-to-current conversion stage 304 is set to cancel third harmonic distortion. FIG. 4 shows an example of $I_{BIAS}$ generated by the current source 338 and the current source 340 versus third harmonic distortion 402 in the two-stage voltage-to-current converter 300. In the example of FIG. 4, for a fixed input voltage and frequency, sweeping $I_{BIAS}$ current shows that there exists a minima in third harmonic distortion.

Figure 5:
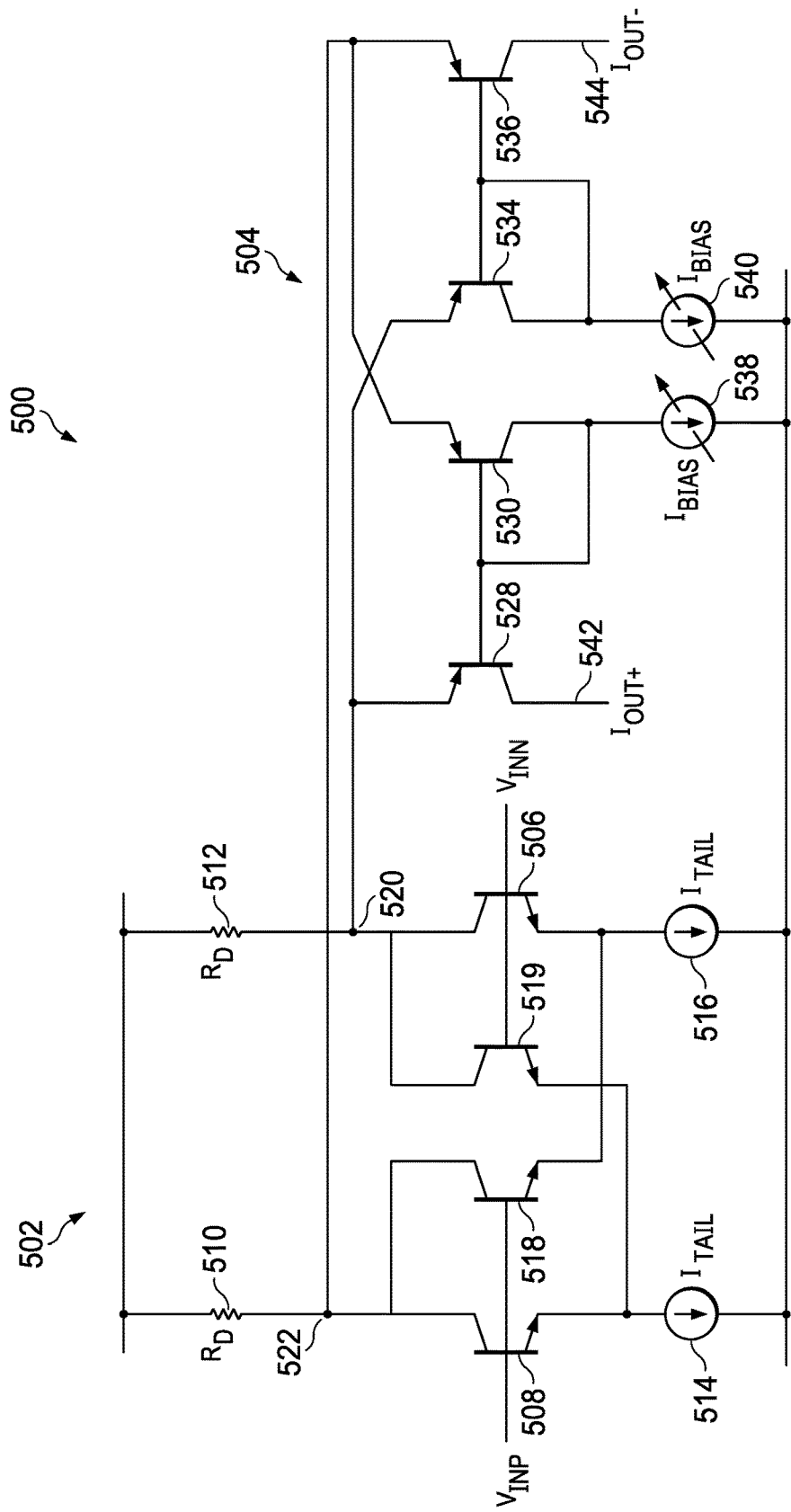
FIG. 5 shows a schematic diagram for a second example of a two-stage voltage-to-current converter that includes an offset differential pair in the first stage in accordance with the present disclosure.

FIG. 5 shows a schematic diagram for an example of a two-stage voltage-to-current converter 500 that includes an offset differential pair in the first stage in accordance with the present disclosure. The two-stage voltage-to-current converter 500 is an implementation of the voltage-to-current converter 106. The two-stage voltage-to-current converter 500 includes a first voltage-to-current conversion stage 502 and a second voltage-to-current conversion stage 504. The voltage-to-current conversion stage 504 is cascaded with the voltage-to-current conversion stage 502. The voltage-to-current conversion stage 502 and the voltage-to-current conversion stage 504 are implementations of the voltage-to-current conversion stage 108 and the voltage-to-current conversion stage 110 respectively. In some implementations, the circuitry of voltage-to-current conversion stage 504 is identical to the circuitry of the voltage-to-current conversion stage 304.

The voltage-to-current conversion stage 502 includes transistor 506, transistor 508, transistor 518, and transistor 519. The transistor 506, the transistor 508, the transistor 518, and the transistor 519 are NPN bipolar transistors in some implementations. Transistor 506 and transistor 508 are connected as a differential pair with emitter area $A_E$. Transistor 518 and transistor 519 are connected as an offset differential pair with emitter area k*$A_E$, where k~1.5 to 3. The transistor 506 and the transistor 519 receive a negative side ($V_{INN}$) of the input signal, and the transistor 508 and the 518 receive a positive side ($V_{INP}$) of the input signal. The transistor 506, the transistor 508, the transistor 518, and the transistor 519 are coupled to a power source by the resistors 510 and 512. The transistor 506 and the transistor 518 are coupled to a voltage reference by the current source 516. The transistor 508 and the transistor 519 are coupled to the voltage reference by the current source 514. The offset differential pair improves the linearity of the voltage-to-current conversion stage 502. The voltage-to-current conversion stage 502 provides a gain function with compressive nonlinearity.

The voltage-to-current conversion stage 504 includes transistor 528, transistor 530, transistor 534, transistor 536, current source 538, and current source 540. The transistor 528, the transistor 530, the transistor 534, and the transistor 536 are PNP bipolar transistors in some implementations. The transistor 528 and the transistor 534 are connected to output 520 of the voltage-to-current conversion stage 502. The transistor 530 and the transistor 536 are connected to output 522 of the voltage-to-current conversion stage 502. The transistor 530 and the transistor 534 are connected diodes. A control terminal (i.e., base terminal) of the transistor 530 is connected to a control terminal (i.e., base terminal) of the transistor 528, and a control terminal (i.e., base terminal) of the transistor 534 is connected to a control terminal (i.e., base terminal) of the transistor 536.

The transistor 528 outputs the current $I_{out}$+ at terminal 542 and the transistor 536 outputs the current $I_{out}$- at terminal 544. The relationship between the output currents $I_{out}$+ and $I_{out}$- and the input voltage received from the voltage-to-current conversion stage 502 is exponential (hyperbolic sine), which, as explained above, is an expansive nonlinearity. The expansive nonlinearity of the voltage-to-current conversion stage 504 compensates for the compressive nonlinearity of the voltage-to-current conversion stage 502 to reduce third harmonic distortion in the voltage-to-current converter 500.

Figure 6:
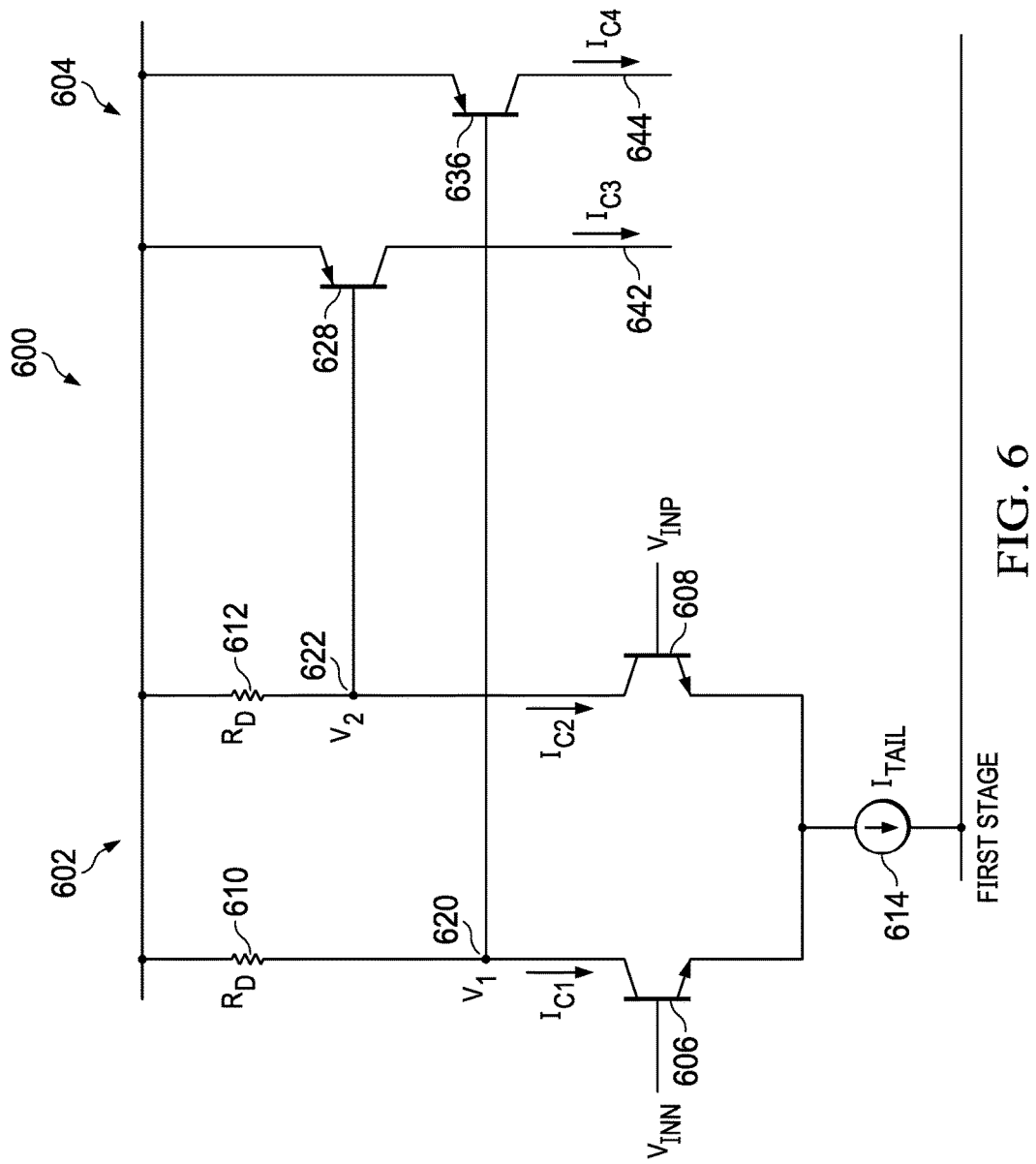
FIG. 6 shows a schematic diagram for a third example of a two-stage voltage-to-current converter in accordance with the present disclosure.

FIG. 6 shows a schematic diagram for a two-stage voltage-to-current converter 600 in accordance with the present disclosure. The two-stage voltage-to-current converter 600 is an implementation of the voltage-to-current converter 106. The two-stage voltage-to-current converter 600 includes a first voltage-to-current conversion stage 602 and a second voltage-to-current conversion stage 604. The voltage-to-current conversion stage 604 is cascaded with the voltage-to-current conversion stage 602. The voltage-to-current conversion stage 602 and the voltage-to-current conversion stage 604 are implementations of the voltage-to-current conversion stage 108 and the voltage-to-current conversion stage 110 respectively. Some implementations of the voltage-to-current conversion stage 602 are similar to the voltage-to-current conversion stage 302.

The voltage-to-current conversion stage 602 includes transistor 606 and transistor 608 connected as a differential pair. The transistor 606 and the transistor 608 are NPN bipolar transistors in some implementations. The transistor 606 receives a negative side ($V_{INN}$) of the input signal and the transistor 608 receives a positive side ($V_{INP}$) of the input signal. The transistor 606 and transistor 608 are coupled to a power source by a resistor 610 and a resistor 612, and coupled to a voltage reference by the current source 614. In the two-stage voltage-to-current converter 600, the values of the resistor 610 and the resistor 612 are set to a value that minimizes or reduces third harmonic distortion in the two-stage voltage-to-current converter 600.

The differential pair formed from the transistor 606 and the transistor 608 provides a hyperbolic tangent relationship between collector currents $I_{C1}$ and $I_{C2}$ and input differential voltage, $V_D = V_{INN} - V_{INP}$. As explained above, the hyperbolic tangent is a compressive nonlinearity.

The voltage-to-current conversion stage 604 includes transistor 628 and transistor 636. The transistor 628 and the transistor 636 are PNP bipolar transistors in some implementations. The transistor 628 (i.e., a control terminal of the transistor 628) is connected to output 620 (i.e., an input terminal of the transistor 606) of the voltage-to-current conversion stage 602. The transistor 636 (i.e., a control terminal of the transistor 636) is connected to output 622 (i.e., the input terminal of the transistor 608) of the voltage-to-current conversion stage 602.

The transistor 628 outputs the current $I_{C3}$ at terminal 642 and the transistor 636 outputs the current $I_{C4}$ at terminal 644. The relationship between the output currents $I_{C3}$ and $I_{C4}$ and the input voltage received from the voltage-to-current conversion stage 602 is exponential (hyperbolic sine), which, as explained above, is an expansive nonlinearity. The expansive nonlinearity of the voltage-to-current conversion stage 604 compensates for the compressive nonlinearity of the voltage-to-current conversion stage 602 to reduce third harmonic distortion in the voltage-to-current converter 600.

Figure 7:
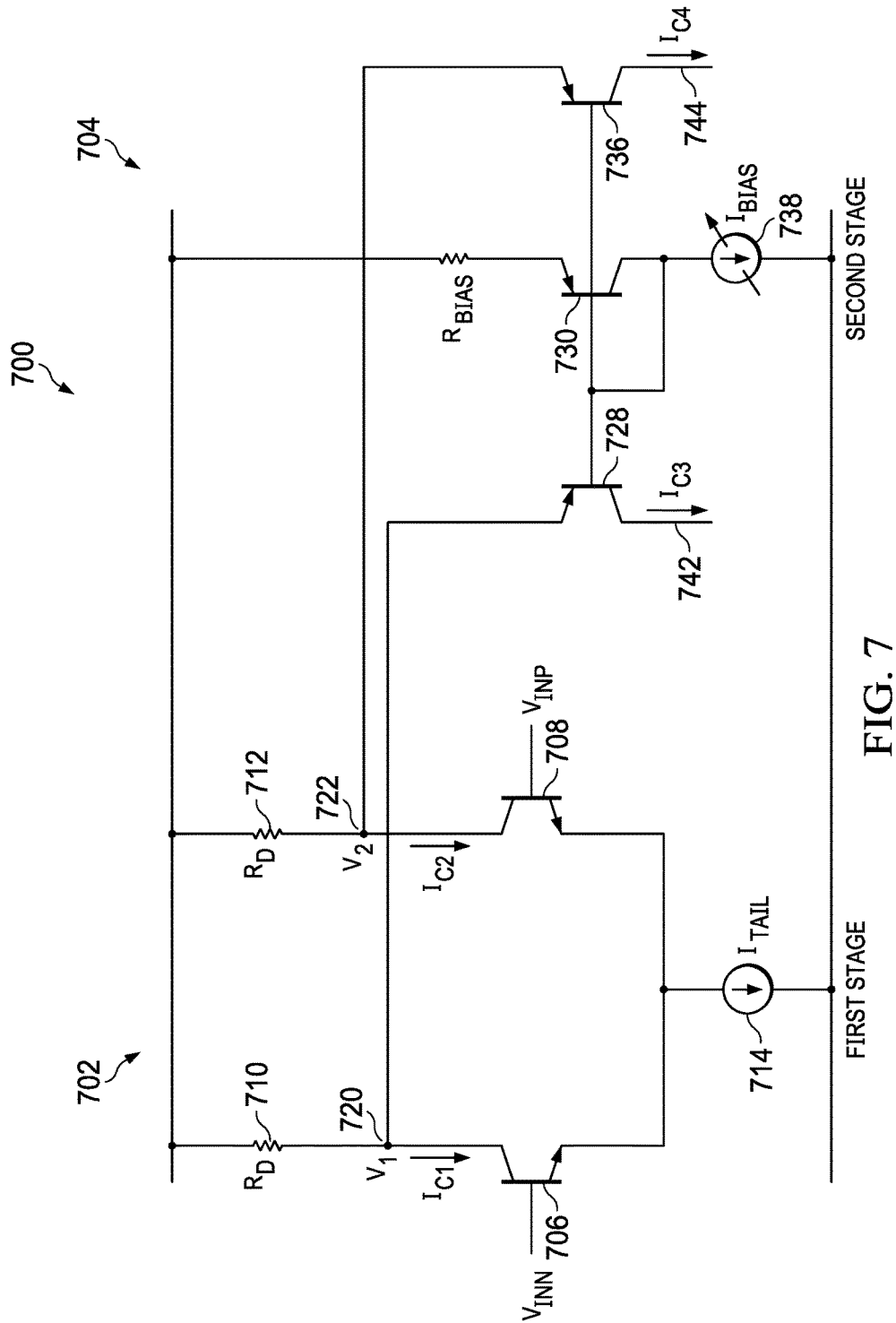
FIG. 7 shows a schematic diagram for a fourth example of a two-stage voltage-to-current converter in accordance with the present disclosure.

FIG. 7 shows a schematic diagram for an example of a two-stage voltage-to-current converter 700 in accordance with the present disclosure. The two-stage voltage-to-current converter 700 is an implementation of the voltage-to-current converter 106. The two-stage voltage-to-current converter 700 includes a first voltage-to-current conversion stage 702 and a second voltage-to-current conversion stage 704. The voltage-to-current conversion stage 704 is cascaded with the voltage-to-current conversion stage 702. The voltage-to-current conversion stage 702 and the voltage-to-current conversion stage 704 are implementations of the voltage-to-current conversion stage 108 and the voltage-to-current conversion stage 110 respectively.

The voltage-to-current conversion stage 702 includes transistor 706 and transistor 708 connected as a differential pair. The transistor 706 and the transistor 708 are NPN bipolar transistors in some implementations. The transistor 706 receives a negative side ($V_{INN}$) of the input signal, and the transistor 708 receives a positive side ($V_{INP}$) of the input signal. The transistor 706 and the transistor 708 are coupled to a power source by the resistors 710 and 712, and coupled to a voltage reference by the current source 714.

The differential pair formed from the transistor 706 and the transistor 708 provides a hyperbolic tangent relationship between collector currents $I_{C1}$ and $I_{C2}$ and input differential voltage, $V_D = V_{INN} - V_{INP}$. As explained above, the hyperbolic tangent is a compressive nonlinearity.

The voltage-to-current conversion stage 704 is a variation of the voltage-to-current conversion stage 304, and includes transistor 728, transistor 730, transistor 736, and current source 738. The transistor 728, the transistor 730, and the transistor 736 are PNP bipolar transistors in some implementations. The transistor 728 is connected to output 720 of the voltage-to-current conversion stage 702. The transistor 736 is connected to output 722 of the voltage-to-current conversion stage 702. The transistor 730 is connected as diode. A control terminal (i.e., a base terminal) of the transistor 730 is connected to a control terminal (i.e., a base terminal) of the transistor 728, and to a control terminal (i.e., a base terminal) of the transistor 736, and the voltage at the control terminals of the transistors 728 and 736 is fixed by the transistor 730.

The transistor 728 outputs the current $I_{C3}$ at terminal 742 and the transistor 736 outputs the current $I_{C4}$ at terminal 744. The expression of the output current of the transistors 728 and 736 shows a compressive nonlinearity in the form of $$\frac{1}{(1 - e^{-x})}$$

embedded in an expanding exponential function.

$$I_{C3} = I_{BIAS} \exp\left(\frac{I_{BIAS} R_B}{V_{TH}}\right) \exp\left(-\frac{R_D}{V_{TH}}\left(\frac{\alpha_F I_{TAIL}}{1 + \exp\left(\frac{-V_D}{V_{TH}}\right)} + \alpha I_{C3}\right)\right)$$

The transistor 730 is connected to the current source 738, and the current source 738 is set to generate a current that results in minimization or reduction of third harmonic distortion in the voltage-to-current converter 700. The expansive nonlinearity of the voltage-to-current conversion stage 704 compensates for the compressive nonlinearity of the voltage-to-current conversion stage 702 to reduce third harmonic distortion in the voltage-to-current converter 700.

Figure 8:
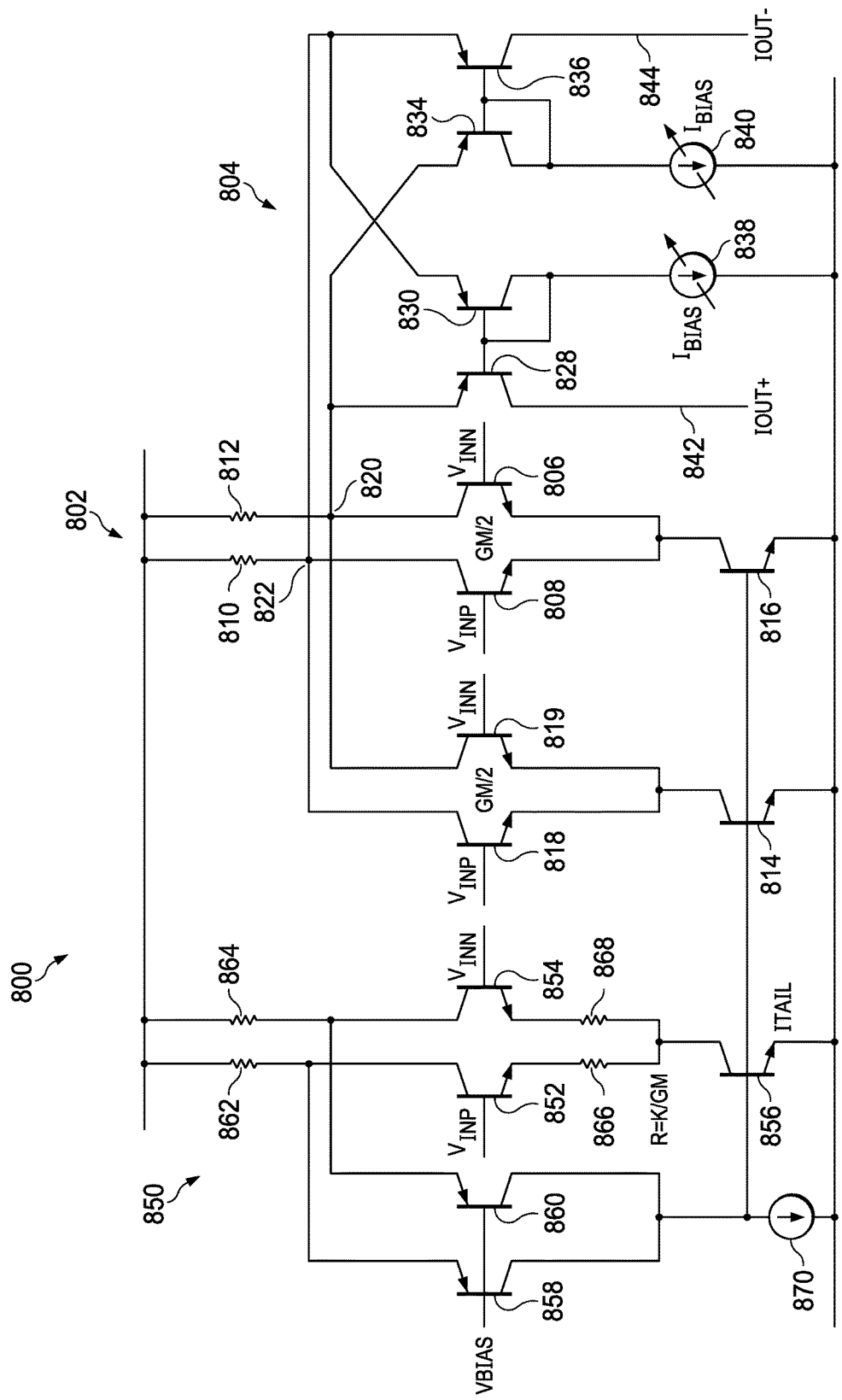
FIG. 8 shows a schematic diagram for an additional example of a two stage voltage-to-current converter in accordance with the present disclosure.

FIG. 8 shows a schematic diagram for an additional example of a two stage voltage-to-current converter 800 in accordance with the present disclosure. The two stage voltage-to-current converter 800 is an implementation of the two-stage voltage-to-current converter 500 and includes an adaptive tail current booster 850 to linearize third harmonic distortion and boost slew in the first voltage-to-current conversion stage. The two-stage voltage-to-current converter 800 includes a first voltage-to-current conversion stage 802, a second voltage-to-current conversion stage 804, and an adaptive tail current booster 850. The voltage-to-current conversion stage 804 is cascaded with the voltage-to-current conversion stage 802. The voltage-to-current conversion stage 802 and the voltage-to-current conversion stage 804 are implementations of the voltage-to-current conversion stage 502 and the voltage-to-current conversion stage 504 respectively. In some implementations, the circuitry of voltage-to-current conversion stage 804 is identical to the circuitry of the voltage-to-current conversion stage 504.

The voltage-to-current conversion stage 802 includes transistor 806, transistor 808, transistor 818, and transistor 819. Transistor 806 and transistor 808 are connected as a differential pair. Transistor 818 and transistor 819 are connected as an offset differential pair. The transistor 806, the transistor 808, the transistor 818, and the transistor 819 are NPN bipolar transistors in some implementations. The transistor 806 and the transistor 819 receive a negative side ($V_{INN}$) of the input signal, and the transistor 808 and the transistor 818 receive a positive side ($V_{INP}$) of the input signal. The transistor 806, the transistor 808, the transistor 818, and the transistor 819 are coupled to a power source by the resistors 810 and 812. The transistor 806 and the transistor 808 are coupled to a voltage reference by the transistor 816. The transistor 818 and the transistor 819 are coupled to the voltage reference by the transistor 814. The offset differential pair improves the linearity of the voltage-to-current conversion stage 802. The voltage-to-current conversion stage 802 provides a gain function with compressive nonlinearity.

The adaptive tail current booster 850 is coupled to the voltage-to-current conversion stage 802. The adaptive tail current booster 850 is a feedback circuit that controls the tail current flowing in the voltage-to-current conversion stage 802 to linearize third harmonic distortion in the two stage voltage-to-current converter 800. The adaptive tail current booster 850 includes a transistor 852, a transistor 854, a transistor 856, a transistor 858, a transistor 860, a resistor 862, a resistor 864, a resistor 866, a resistor 868, and a current source 870. The transistor 852, the transistor 854, and the transistor 856 are NPN transistors in some implementations. The transistor 858 and the transistor 860 are PNP transistors in some implementations. The transistor 852 and the transistor 854 are connected as a differential pair. The transistor 852 receives a negative side ($V_{INN}$) of the input signal, and the transistor 854 receives a positive side ($V_{INP}$) of the input signal. The resistor 862 couples the transistor 852 and the transistor 858 to a power source. The resistor 864 couples the transistor 854 and the transistor 860 to the power source. The transistor 858 and the transistor 860 are coupled to a reference voltage rail (e.g., ground) via the current source 870. The tail current in the transistor 856 is controlled by the transistor 858 and the transistor 860, which in turn is a function of the currents flowing in the transistor 852 and the transistor 854. Differential input voltage $V_{INP}$ and $V_{INN}$ causes the transistor 858 and the transistor 860 to control the transistor 856 so that a minimum current is maintained in the one of the transistor 852 and the transistor 854 that is turning off. The tail current set in the transistor 856 is proportionally mirrored in the transistor 814 and transistor 816 of the voltage-to-current conversion stage 802.

The voltage-to-current conversion stage 804 includes transistor 828, transistor 830, transistor 834, transistor 836, current source 838, and current source 840. The transistor 828, the transistor 830, the transistor 834, and the transistor 836 are PNP bipolar transistors in some implementations. The transistor 828 and the transistor 834 are connected to output 820 of the voltage-to-current conversion stage 802. The transistor 830 and the transistor 836 are connected to output 822 of the voltage-to-current conversion stage 802. The transistor 830 and the transistor 834 are connected diodes. A control terminal (i.e., base terminal) of the transistor 830 is connected to a control terminal (i.e., base terminal) of the transistor 828, and a control terminal (i.e., base terminal) of the transistor 834 is connected to a control terminal (i.e., base terminal) of the transistor 836.

The transistor 828 outputs the current $I_{out}+$ at terminal 842 and the transistor 836 outputs the current $I_{out}-$ at terminal 844. The relationship between the output currents $I_{out}+$ and $I_{out}-$ and the input voltage received from the voltage-to-current conversion stage 802 is exponential (hyperbolic sine), which, as explained above, is an expansive nonlinearity. The expansive nonlinearity of the voltage-to-current conversion stage 804 compensates for the compressive nonlinearity of the voltage-to-current conversion stage 802 to reduce third harmonic distortion in the two stage voltage-to-current converter 800.

While various implementations of a two-stage voltage-to-current converter disclosure have been described herein with respect to bipolar transistors, some implementations include field effect transistor rather than bipolar transistors.

The above discussion is meant to be illustrative of the principles and various implementations of the present invention. Numerous variations and modifications will become apparent to those skilled in the art once the above disclosure is fully appreciated. It is intended that the following claims be interpreted to embrace all such variations and modifications.

What is claimed is:

1. An amplifier, comprising:
an input stage, comprising:
a first voltage-to-current conversion stage, the first voltage-to-current conversion stage configured to provide an input-to-output gain with compressive nonlinearity;
a second voltage-to-current conversion stage cascaded with the first voltage-to-current conversion stage, wherein:
an input of the second voltage-to-current conversion stage is connected to an output of the first voltage-to-current conversion stage; and
the second voltage-to-current conversion stage is configured to provide an input-to-output gain with expansive nonlinearity;
wherein the first voltage-to-current conversion stage comprises a first transistor and a second transistor connected as a differential pair.

2. An amplifier, comprising:
an input stage, comprising:
a first voltage-to-current conversion stage, the first voltage-to-current conversion stage configured to provide an input-to-output gain with compressive nonlinearity;
a second voltage-to-current conversion stage cascaded with the first voltage-to-current conversion stage, wherein:
an input of the second voltage-to-current conversion stage is connected to an output of the first voltage-to-current conversion stage; and
the second voltage-to-current conversion stage is configured to provide an input-to-output gain with expansive nonlinearity;
wherein the first voltage-to-current conversion stage comprises a third transistor and a fourth transistor connected to the differential pair as an offset differential pair.

3. An amplifier, comprising:
an input stage, comprising:
a first voltage-to-current conversion stage, the first voltage-to-current conversion stage configured to provide an input-to-output gain with compressive nonlinearity;
a second voltage-to-current conversion stage cascaded with the first voltage-to-current conversion stage, wherein:
an input of the second voltage-to-current conversion stage is connected to an output of the first voltage-to-current conversion stage; and
the second voltage-to-current conversion stage is configured to provide an input-to-output gain with expansive nonlinearity;
wherein the second voltage-to-current conversion stage comprises:
a first diode connected transistor connected to a first output of the first voltage-to-current conversion stage;
a second diode connected transistor connected to a second output of the first voltage-to-current conversion stage;
a first transistor connected to the first output of the first voltage-to-current conversion stage and to a control terminal of the second diode connected transistor; and
a second transistor connected to the second output of the first voltage-to-current conversion stage and to a control terminal of the first diode connected transistor.

4. The amplifier of claim 3, further comprising an adaptive tail current booster coupled to the first voltage-to-current conversion stage, the adaptive tail current booster configured to control a current flowing in the first voltage-to-current conversion stage based on an amplitude of an input signal to be amplified by the first voltage-to-current conversion stage.

5. The amplifier of claim 3, further comprising:
a first current source coupled to the first diode connected transistor;
a second current source coupled to the second diode connected transistor;

wherein the first current source and the second current source are configured to generate a bias current in the second voltage-to-current conversion stage that cancels third harmonic distortion at a selected input voltage of the first voltage-to-current conversion stage.

6. An amplifier, comprising:
an input stage, comprising:
  a first voltage-to-current conversion stage, the first voltage-to-current conversion stage configured to provide an input-to-output gain with compressive nonlinearity;
  a second voltage-to-current conversion stage cascaded with the first voltage-to-current conversion stage, wherein:
    an input of the second voltage-to-current conversion stage is connected to an output of the first voltage-to-current conversion stage; and
    the second voltage-to-current conversion stage is configured to provide an input-to-output gain with expansive nonlinearity;
  wherein the second voltage-to-current conversion stage comprises:
  a first transistor coupled to a first output of the first voltage-to-current conversion stage, the first transistor comprising a control terminal connected to the first output of the first voltage-to-current conversion stage; and
  a second transistor coupled to a second output of the first voltage-to-current conversion stage, the second transistor comprising a control terminal connected to the second output of the first voltage-to-current conversion stage.

7. An amplifier, comprising:
an input stage, comprising:
  a first voltage-to-current conversion stage, the first voltage-to-current conversion stage configured to provide an input-to-output gain with compressive nonlinearity;
  a second voltage-to-current conversion stage cascaded with the first voltage-to-current conversion stage, wherein:
    an input of the second voltage-to-current conversion stage is connected to an output of the first voltage-to-current conversion stage; and
    the second voltage-to-current conversion stage is configured to provide an input-to-output gain with expansive nonlinearity;
  wherein the second voltage-to-current conversion stage comprises:
  a first transistor connected to a first output of the first voltage-to-current conversion stage;
  a second transistor connected to a second output of the first voltage-to-current conversion stage; and
  a first diode connected transistor connected to a control terminal of the first transistor and a control terminal of the second transistor.

8. A voltage-to-current converter, comprising:
a first stage, comprising a first transistor and a second transistor connected as a differential pair;
a second stage cascaded with the first stage, the second stage comprising:
  a third transistor coupled to the first transistor, the third transistor connected to an output terminal of the first transistor and connected to generate a first current output of the second stage at an output terminal of the third transistor; and
  a fourth transistor coupled to the second transistor, the fourth transistor connected to an output terminal of the second transistor and connected to generate a second current output of the second stage at an output terminal of the fourth transistor;
wherein the first stage further comprises a fifth transistor and a sixth transistor connected to the first transistor and the second transistor as an offset differential pair.

9. A voltage-to-current converter, comprising:
a first stage, comprising a first transistor and a second transistor connected as a differential pair;
a second stage cascaded with the first stage, the second stage comprising:
  a third transistor coupled to the first transistor, the third transistor connected to an output terminal of the first transistor and connected to generate a first current output of the second stage at an output terminal of the third transistor; and
  a fourth transistor coupled to the second transistor, the fourth transistor connected to an output terminal of the second transistor and connected to generate a second current output of the second stage at an output terminal of the fourth transistor;
wherein the second stage further comprises:
  a fifth transistor connected as a diode, wherein an input terminal of the fifth transistor is connected to the output terminal of the second transistor and connected to an input terminal of the fourth transistor;
  a sixth transistor connected as a diode, wherein an input terminal of the sixth transistor is connected to the output terminal of the first transistor and connected to an input terminal of the third transistor.

10. The voltage-to-current converter of claim 9, wherein:
a control terminal of the third transistor is connected to a control terminal of the fifth transistor; and
a control terminal of the fourth transistor is connected to a control terminal of the sixth transistor.

11. The voltage-to-current converter of claim 9, further comprising:
a first current source coupled an output terminal of the fifth transistor; and;
a second current source coupled to an output terminal of the sixth transistor;
wherein the first current source and the second current source are configured to generate a bias current in the second stage that cancels third harmonic distortion at a selected input voltage of the first stage.

12. A voltage-to-current converter, comprising:
a first stage, comprising a first transistor and a second transistor connected as a differential pair;
a second stage cascaded with the first stage, the second stage comprising:
  a third transistor coupled to the first transistor, the third transistor connected to an output terminal of the first transistor and connected to generate a first current output of the second stage at an output terminal of the third transistor; and
  a fourth transistor coupled to the second transistor, the fourth transistor connected to an output terminal of the second transistor and connected to generate a second current output of the second stage at an output terminal of the fourth transistor;
further comprising an adaptive tail current booster coupled to the first stage, the adaptive tail current booster configured to control a current flowing in the first stage based on an amplitude of an input signal to be amplified by the first stage.

13. A voltage-to-current converter, comprising:
a first stage, comprising a first transistor and a second transistor connected as a differential pair;
a second stage cascaded with the first stage, the second stage comprising:
 a third transistor coupled to the first transistor, the third transistor connected to an output terminal of the first transistor and connected to generate a first current output of the second stage at an output terminal of the third transistor; and
 a fourth transistor coupled to the second transistor, the fourth transistor connected to an output terminal of the second transistor and connected to generate a second current output of the second stage at an output terminal of the fourth transistor; wherein:
a control terminal of the third transistor is connected to an input terminal of the first transistor; and
a control terminal of the fourth transistor is connected to an input terminal of the second transistor.

14. A voltage-to-current converter, comprising:
a first stage, comprising a first transistor and a second transistor connected as a differential pair;
a second stage cascaded with the first stage, the second stage comprising:
 a third transistor coupled to the first transistor, the third transistor connected to an output terminal of the first transistor and connected to generate a first current output of the second stage at an output terminal of the third transistor; and
 a fourth transistor coupled to the second transistor, the fourth transistor connected to an output terminal of the second transistor and connected to generate a second current output of the second stage at an output terminal of the fourth transistor;
wherein the second stage further comprises:
a fifth transistor connected as a diode, wherein a control terminal of the fifth transistor is connected to a control terminal of the third transistor and to a control terminal of the fourth transistor.

15. A voltage-to-current converter, comprising:
a first stage, comprising a first transistor and a second transistor connected as a differential pair;
a second stage cascaded with the first stage, the second stage comprising:
 a third transistor coupled to the first transistor, the third transistor comprising:
  an emitter terminal connected to a collector terminal of the first transistor;
  a collector terminal to provide a first current output of the second stage;
 a fourth transistor coupled to the second transistor, the fourth transistor comprising:
  an emitter terminal connected to a collector terminal of the second transistor;
  a collector terminal to provide a second current output of the second stage;
 a fifth transistor connected as a diode, the fifth transistor comprising an emitter terminal connected to the collector terminal of the second transistor and connected to the emitter terminal of the fourth transistor; and
 a sixth transistor connected as a diode, the sixth transistor comprising an emitter terminal connected to the collector terminal of the first transistor and connected to the emitter terminal of the third transistor.

16. The voltage-to-current converter of claim 15, wherein the first stage further comprises a fifth transistor and a sixth transistor connected to the first transistor and the second transistor as an offset differential pair.

17. The voltage-to-current converter of claim 15, wherein the second stage further comprises:
a first current source coupled a collector terminal of the fifth transistor; and;
a second current source coupled to a collector terminal of the sixth transistor;
wherein the first current source and the second current source are configured to generate a bias current in the second stage that cancels third harmonic distortion at a selected input voltage of the first stage.

* * * * *